(12) United States Patent
Lhuillier

(10) Patent No.: US 9,425,384 B2
(45) Date of Patent: Aug. 23, 2016

(54) METHOD FOR MANUFACTURING A HIGH-TEMPERATURE ULTRASONIC TRANSDUCER USING A LITHIUM NIOBATE CRYSTAL BRAZED WITH GOLD AND INDIUM

(75) Inventor: Christian Lhuillier, Aix en Provence (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 433 days.

(21) Appl. No.: 14/130,296

(22) PCT Filed: Jun. 29, 2012

(86) PCT No.: PCT/EP2012/062675
§ 371 (c)(1),
(2), (4) Date: Feb. 12, 2014

(87) PCT Pub. No.: WO2013/001056
PCT Pub. Date: Jan. 3, 2013

(65) Prior Publication Data
US 2014/0215784 A1   Aug. 7, 2014

(30) Foreign Application Priority Data
Jun. 30, 2011   (FR) ...................................... 11 55880

(51) Int. Cl.
*H01L 41/25*   (2013.01)
*B06B 1/06*   (2006.01)
(Continued)

(52) U.S. Cl.
CPC .............. *H01L 41/25* (2013.01); *B06B 1/0644* (2013.01); *G21C 17/00* (2013.01); *H01L 41/0477* (2013.01); *H01L 41/29* (2013.01); *H01L 41/313* (2013.01); *Y10T 29/42* (2015.01)

(58) Field of Classification Search
CPC .. B06B 1/0644; G21C 17/00; H01L 41/0477; H01L 41/25; H01L 41/29; H01L 41/313; Y10T 29/42
See application file for complete search history.

(56) References Cited

U.S. PATENT DOCUMENTS 4,297,607 A * 10/1981 Lynnworth ............. B06B 1/067
310/327
5,325,012 A * 6/1994 Sato ....................... H01L 41/313
228/121

(Continued)

FOREIGN PATENT DOCUMENTS

| JP | S52-066386 A | 6/1977 |
| JP | S55-151899 A | 11/1980 |
| JP | 2007-165385 A | 6/2007 |

OTHER PUBLICATIONS

Office Action in Japanese Patent Application No. 2014-517729, dated Mar. 1, 2016.

(Continued)

*Primary Examiner* — Carl Arbes
(74) *Attorney, Agent, or Firm* — Baker & Hostetler LLP

(57) ABSTRACT

A process for manufacturing a high-temperature ultrasonic transducer, said transducer comprising a steel or metal top electrode, a piezoelectric converter, a steel or metal support ensuring the interface between the converter and the propagation medium of the acoustic waves, a first joint between the support and the piezoelectric crystal, and a second joint between the converter and the top electrode, comprises, to produce said gold-and-indium-based joints, a brazing and diffusing operation comprising the following steps: a first step of increasing temperature to a first temperature comprised between about 150° C. and about 400° C. and of maintaining this first temperature for a first length of time corresponding to a first plateau; and a second step of increasing temperature to a second temperature comprised between about 400° C. and about 1000° C. and of maintaining this second temperature for a second length of time corresponding to a second plateau.

23 Claims, 3 Drawing Sheets

(51) Int. Cl.
*H01L 41/047* (2006.01)
*H01L 41/29* (2013.01)
*H01L 41/313* (2013.01)
*G21C 17/00* (2006.01)

(56) References Cited

U.S. PATENT DOCUMENTS 6,545,387 B2 * 4/2003 Lee .................. C01G 23/003
310/313 A
6,845,664 B1 * 1/2005 Okojie ................ B81B 7/0061
257/433
6,904,921 B2 * 6/2005 Beck .................. B06B 1/0618
134/184

2007/0013014 A1 * 1/2007 Guo .................. C23C 14/021
257/417

OTHER PUBLICATIONS

B. Butler et al., "Techniques for the Generation of Ultrasound for Extended Periods at High Temperatures", Ultrasonics, Nov. 1979, vol. 17, No. 6, pp. 249-254.
R. Kazys et al., "Development of Ultrasonic Sensors for Operation in a Heavy Liquid Metal", Sensors Journal, Oct. 2006, vol. 6, No. 5, pp. 1134-1143.
J. T. Krause, "Gold—Indium Bond for Measurement of Ultrasonic Properties in Solids at High Temperatures", Journal of Applied Physics, vol. 39, No. 11, 1968, pp. 5334-5335.

* cited by examiner

METHOD FOR MANUFACTURING A HIGH-TEMPERATURE ULTRASONIC TRANSDUCER USING A LITHIUM NIOBATE CRYSTAL BRAZED WITH GOLD AND INDIUM

CROSS-REFERENCE TO RELATED APPLICATIONS

This application is a National Stage of International patent application PCT/EP2012/062675, filed on Jun. 29, 2012, which claims priority to foreign French patent application No. FR 1155880, filed on Jun. 30, 2011, the disclosures of which are incorporated by reference in their entirety.

FIELD OF THE INVENTION

The field of the invention is that of devices that act as emitters, receivers or transceivers of ultrasonic or acoustic waves able to propagate in solids and fluids, which devices will be designated in the description: high-temperature ultrasonic transducers (a.k.a TUSHTs from the French "traducteur ultrasonore haute temperature"), and that are designed to operate at high temperatures, typically above several hundred degrees Celsius.

BACKGROUND

Generally, acoustic waves may be longitudinal waves (propagation in fluids and solids) or transverse waves (propagation in solids and viscous fluids, for example) or combinations of these two types of waves (propagation of surface and guided waves in solids).

At the present time there is a need to increase the operating range of ultrasonic or acoustic transducers and their operating lifetime especially under the physical conditions found in the hot plenum of the main vessel of fast neutron reactors cooled with liquid metal.

This type of transducer may find applications in fast neutron reactors though for this purpose satisfactory operation of the transducers needs to be obtained notably under the following indicative physical conditions:
  immersion in liquid metal or alloy (sodium for example);
  working temperature under normal conditions: 200° C. (reactor shutdown), 550° C. (reactor operating);
  working temperature under incidental conditions: 700° C.;
  temperature cycles between 200° C. and 550° C.;
  occasional temperature gradient (thermal shock): −20° C./s between 550° C. and 400° C.;
  a flux of fast and thermal neutrons and gamma photons;
  an operating lifetime of several tens of years (reactor service lifetime: 60 years); and
  test or initial conditioning temperatures above the operating temperature (about 600° C. for use at 550° C.).

These transducers must also be able to operate at room temperature (a few degrees) for laboratory tests.

These transducers must be able to operate as emitters of acoustic or ultrasonic waves, as receivers of acoustic or ultrasonic waves, and as transceivers.

Lastly, these transducers must be able to operate over a wide range of acoustic or ultrasonic frequencies, typically almost continuously up to several megahertz.

Because of their generic features, the improvements to these transducers are also relevant to other fields of applications such as the instrumentation of pressurized-water reactors or indeed even high-temperature instrumentation in non-nuclear industries.

As is known, acoustic waves are generated and/or received using an element made of a piezoelectric or magnetostrictive or electromagnetic acoustic (EMAT) material for converting electrical power into mechanical energy and/or vice versa.

The (piezoelectric, for example) converter element is separated from the propagation medium of the waves by a protective plate (generally made of a metal or a metal alloy) called, in the description, the support plate (sometimes referred to as an interface plate, separating plate, phase plate, coupling plate, front plate, front face, diaphragm, etc.) or more generally the support, which in practice may be integrated into a portion of a housing or a part to be inspected, or of a waveguide.

In order to obtain a satisfactory performance, it is notably recommended to specify:
  the choice of the converter material;
  the choice of the support material, and more generally of the housing;
  the choice and implementation of the type of bond (joint) between the converter material and the support, this bond needing to provide mechanical and acoustic functions, i.e. to be capable of transmitting ultrasound over a wide frequency range (almost continuously up to a few megahertz) and over a wide temperature range (from a few degrees to 550° C., even 700° C.). On its second face, the converter material is coupled to an electrode, this coupling possibly being achieved in the same way as between the converter material and the support, or possibly being achieved differently. Specifically, it may be advantageous for the electrode not to be acoustically coupled to the converter element. The plate may serve as a second electrode. It is necessary for the bond to be compatible with the electrical function of the electrodes (electrode and support, both made of conductive materials), i.e. for it not to introduce between the electrodes and the converter an element the electrical (resistivity) and/or dielectric properties of which may hinder a resistive and/or capacitive, for example, contact electrical coupling between said electrodes and the converter.

The following assembly "support/first joint/converter material/second joint/electrode", denoted "assembly" in the rest of the description, must operate (mechanically, electrically and acoustically) durably and have characteristics that are stable under the extreme conditions listed above.

One technique sometimes employed consists in making use of waveguides, one end of which makes contact with the high-temperature medium, the other end, located in a cooler zone that is subjected to a low nuclear flux, bearing a conventional low-temperature transducer. These devices are tricky to implement, notably in the presence of temperature gradients and instabilities.

It will moreover be noted that the so-called "high-temperature" ultrasonic transducers commercially available do not allow the required performance to be achieved with respect to temperature range, frequency range, and operating lifetime. This is because these transducers are notably limited by:
  the piezoelectric converter material having an insufficiently high Curie temperature, for example;
  the type of joint used between this material and the plate (housing): adhesives, pastes, liquefiable seals, etc. not being able to withstand the temperature experienced or the temperature cycles or gradients, or not being able to withstand the mechanical stresses induced by the temperature or the operation of the transducer, or indeed even causing the transducer to degrade via chemical reaction or attack, etc.; and the type of joint used between this material and the plate; dry compressive contact (screw, spring) for example is not suitable for transmitting high-frequency ultrasound. In addition, the materials used (converter, joint) are often weakened under nuclear radiation conditions.

SUMMARY OF THE INVENTION

This is why one subject of the present invention is a process for manufacturing a high-temperature ultrasonic transducer, said transducer comprising a steel or metal top electrode, a piezoelectric converter, a steel or metal support ensuring the interface between the converter and the propagation medium of the acoustic waves, a first joint between the support and the piezoelectric crystal, and a second joint between the converter and the top electrode, characterized in that it comprises the following steps to produce said joints:
  depositing a gold layer then depositing an indium layer on one of the faces of the top electrode, on both faces of the converter, and on one face of the steel support;
  stacking the support, the converter, and the top electrode, this stack being maintained under pressure; and
  producing the indium-and-gold-compound-based first and second joints via a brazing and diffusing operation,
  said brazing and diffusing operation comprising the following steps:
    a first step of increasing temperature to a first temperature comprised between about 150° C. and about 400° C. and of maintaining this first temperature for a first length of time corresponding to a first plateau; and
    a second step of increasing temperature to a second temperature comprised between about 400° C. and about 1000° C. and of maintaining this second temperature for a second length of time corresponding to a second plateau.

Another subject of the invention is a process for manufacturing a high-temperature ultrasonic transducer, said transducer comprising a steel or metal top electrode, a piezoelectric converter, a steel or metal support ensuring the interface between the converter and the propagation medium of the acoustic waves, a first joint between the support and the piezoelectric crystal, and a second joint between the converter and the top electrode, characterized in that it furthermore comprises the following steps to produce said joints:
  depositing a gold layer then depositing an indium layer on a first face of the converter, and on one face of the steel support;
  the second face of the converter being, independently of the treatment carried out on the face of the electrode, left bare, or covered with a gold layer then an indium layer, or covered with a gold layer or a layer of any other, preferably non-oxidizable, material the electrical and dielectric properties of which are compatible with resistive and/or capacitive, for example, contact electrical coupling of the converter and the electrode;
  the face of the electrode possibly being, independently of the treatment carried out on the second face of the converter, left bare, or covered with a gold layer then an indium layer, or covered with a gold layer or a layer of any other, preferably non-oxidizable, material the electrical and dielectric properties of which are compatible with resistive and/or capacitive, for example, contact electrical coupling of the electrode and the converter;
  stacking the support and the converter, this stack being maintained under pressure, said first face of the converter facing said support;
  producing the indium-and-gold-compound-based first joint via a brazing and diffusing operation,
  said brazing and diffusing operation comprising the following steps:
    a first step of increasing temperature to a first temperature comprised between about 150° C. and about 400° C. and of maintaining this first temperature for a first length of time corresponding to a first plateau; and
    a second step of increasing temperature to a second temperature comprised between about 400° C. and about 1000° C. and of maintaining this second temperature for a second length of time corresponding to a second plateau,
  stacking the top electrode on the converter; and
  producing the second joint by bringing the converter and the top electrode into contact.

Thus, according to the present invention, the fact that the brazing and diffusing operation comprises a first plateau at a "medium" temperature, then a second plateau at a "high" temperature makes it possible to ensure a very high junction quality that is particularly well suited to the applications targeted by the present application.

According to one variant of the invention, the piezoelectric material is lithium niobate.

The lithium niobate may take any of its forms and chemical compositions and be produced by any process, for example the lithium niobate may be: single-crystal or polycrystalline lithium niobate, congruent, stoichiometric or quasi-stoichiometric lithium niobate, reduced lithium niobate (black lithium niobate), have alternating or inverted polarization domains, be periodically polarized (PPL, periodically poled lithium niobate), and/or be doped (inclusion or substitution of chemical elements); the lithium niobate may be produced using any technique including, for example: pulling using the Czochralski or modified Czochralski method, zone melt processing, or sol-gel processing.

According to one variant of the invention, the atomic percentage of indium is lower than about 35%.

According to one variant of the invention, the lithium niobate is a natural niobate or a niobate enriched with the lithium-7 isotope.

According to one variant of the invention, the lithium niobate has a Z-cut orientation (Y 90°).

According to one variant of the invention, the lithium niobate has a 36° Y-cut orientation or a 163° Y-cut orientation.

According to one variant of the invention, said first temperature is above the melting point of pure indium.

According to one variant of the invention, said first temperature is about 170° C.

According to one variant of the invention, said second temperature is about 650° C.

According to one variant of the invention, the first temperature has a slight positive gradient during the first length of time.

According to one variant of the invention, the first length of time is about 1 hour, the second length of time being about 2 hours, the temperature increase between said first temperature and said second temperature taking about 4 hours.

According to one variant of the invention, the steps for producing the brazed joints are carried out under a secondary vacuum possibly of about $10^{-5}$ mbar.

According to one variant of the invention, the steps for producing the brazed joints are carried out while maintaining the assembly under a moderate compressive stress, which may be less than about 2 kg/cm$^2$.

According to one variant of the invention, the process comprises integrating the support/first junction/converter/ second junction/top electrode assembly into a housing, said support being a plate integrated into said housing.

According to one variant of the invention, said housing comprises aerating means allowing the oxygen content in said housing to be renewed.

According to one variant of the invention, the process furthermore comprises, to produce the brazed joints:
- assembling the assembly made up of the top electrode, the converter and the support, or the converter and the support, in the presence of an intermediate foil based on gold and indium or mixtures of gold and indium between each of the aforementioned elements; and
- a brazing and diffusing operation.

According to one variant of the invention, the process furthermore comprises producing preliminary gold layers on those faces of said elements which are intended to face each other during the brazing assembly operation so as to promote the adherence of said foils based on gold and indium or mixtures of gold and indium.

According to one variant of the invention, the layers are deposited by sputtering.

According to one variant of the invention, the process furthermore comprises prior to depositing the gold layers, producing tie layers on the faces of the electrode and/or of the converter and/or of the support.

The tie layer may also act as a barrier with respect to migration of the gold and/or indium elements into the materials located on either side of the joints, during the depositions and/or under the temperature and pressure conditions preceding the brazing operations. This thus makes it possible to prevent the deposits from penetrating into the materials before the brazing operation.

According to one variant of the invention, the one or more tie layers are based on chrome and/or chrome nickel or titanium.

According to one variant of the invention, the process furthermore comprises depositing a protective layer on the indium layer.

According to one variant of the invention, the protective layer is based on gold.

BRIEF DESCRIPTION OF THE DRAWINGS

The invention will be better understood and other advantages will become apparent on reading the following description given by way of nonlimiting example and with reference to the appended figures, in which.

DETAILED DESCRIPTION

The present invention will be described in the context of the embodiment of an ultrasonic transducer integrated into a housing, and notably to be used to detect hardware flaws, the presence of gas bubbles, etc. in sodium, a medium that is opaque making optical detection impossible, or to detect noise.

The advantage of the present invention notably lies in the constituent materials of the joints produced by brazing, which allow acoustic waves to be transmitted over a wide frequency band.

First Embodiment of an Assembly Used in a Transducer of the Invention

Figure 1A:
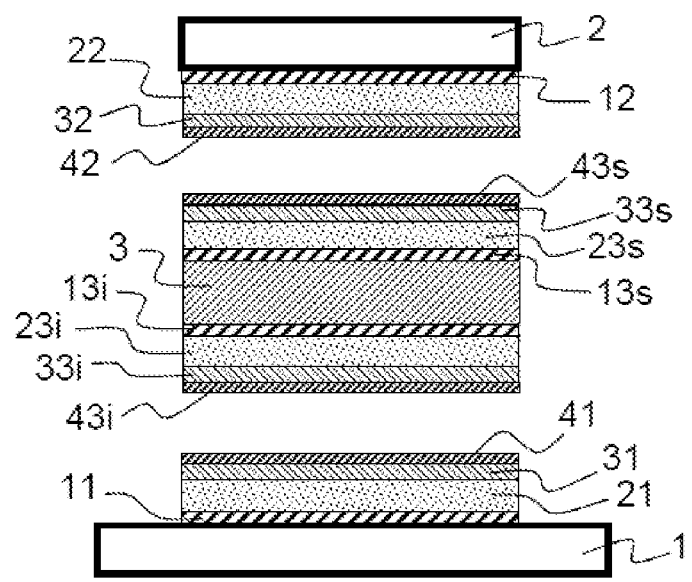
FIGS. 1a and 1b illustrate a first embodiment of a transducer according to the invention.

The following stacks of layers were produced on each of the elements: support, converter, top electrode, said support corresponding to the plate of a housing. Thus, as illustrated in FIG. 1:

A support 1 is covered with a stack of layers consisting of the following layers:
- a tie layer 11;
- a gold layer 21;
- an indium layer 31; and
- a protective layer 41.

A top electrode 2 also comprises the following stack of layers:
- a protective layer 42;
- an indium layer 32;
- a gold layer 22; and
- a tie layer 12.

A converter possibly consisting of a piezoelectric crystal 3 comprises, on its bottom face, the following stack of layers:
- a protective layer 43i;
- an indium layer 33i;
- a gold layer 23i; and
- a tie layer 13i, and on its top face a symmetric stack of layers, i.e.:
- a tie layer 13s;
- a gold layer 23s;
- an indium layer 33s;
- a protective layer 43s.

Advantageously, the plate type support and the electrode called the top electrode may be made of steel of various sorts, the most commonly used steel being 304L austenitic steel (optionally cast in vacuo).

Figure 1B:
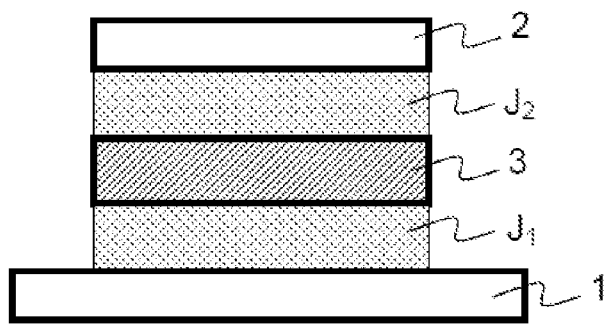

After assembly, the transducer structure illustrated in FIG. 1b is obtained, FIG. 1b showing the first and second joints $J_1$ and $J_2$ located, respectively, between the support and the converter, on the one hand, and between the converter and the top electrode, on the other hand.

The converter may be a disk of:
- congruent single-crystal Z-cut lithium niobate (axis of the disk lying parallel to the "optical" axis of the crystal) produced by the growth technique called "Czochralski" pulling, the planar faces of the lithium niobate discs are initially polished or clear polished;
- natural lithium niobate enabling high-temperature operation (theoretical limit of about 1140° C.);
- lithium-7-enriched lithium niobate produced from lithium-7-enriched lithium carbonate having a lithium-7 isotope content higher than 99.9% and natural niobium oxide, and in addition making operation under a high neutron flux possible; or
- lithium niobate (natural or lithium-7 enriched) possibly having been subjected, before growth of the crystal, to a heat treatment intended to remove $CO_2$ gas from the raw materials.

It will be noted that using 304L steel and the crystal cut called the "Z-cut" allows these two materials to be favorably assembled by brazing, the values of their thermal expansion coefficients being sufficiently similar in the plane of the joint.

Advantageously, the four layers deposited in succession on each of the elements may be deposited by vacuum sputtering, and this in one and the same cycle, the vacuum not being broken between the various deposition phases.

The deposits (their natures and thicknesses) are identical on each of the faces to be assembled by brazing for reasons of symmetry, the thicknesses possibly also not being identical.

Two example stacks of metal layers are given below, the first layer being that deposited on the support or the converter or the electrode.

Example A

| Layer | Function | Material | Thickness (microns) |
| --- | --- | --- | --- |
| 1st layer | Tie | Chromium | 0.05 |
| 2nd layer | Brazing | Gold | 5 |
| 3rd layer | Brazing | Indium | 2 |
| 4th layer | Protective | Gold | 0.1 |

Example B

| Layer | Function | Material | Thickness (microns) |
| --- | --- | --- | --- |
| 1st layer | Tie | Nickel/Chromium 80/20 | 0.05 |
| 2nd layer | Brazing | Gold | 5 |
| 3rd layer | Brazing | Indium | 2 |
| 4th layer | Protective | Gold | 0.15 |

The junctions $J_1$ and $J_2$ are produced by virtue of the brazing cycle carried out under the following conditions:
  the parts to be assembled are positioned metallized face against metallized face, and held under moderate pressure (the value conventionally used is a few $10^2$ g/cm$^2$, less than 2 kg/cm$^2$, for converters between 40 and 15 mm in diameter) throughout the cycle; and
  the parts thus positioned are subjected to a brazing cycle in an oven under vacuum (i.e. at a pressure lower than or equal to $3\times10^{-5}$ torr, i.e. $4\times10^{-5}$ mb or $4\times10^{-3}$ Pa) without gas flow.

Figure 2A:
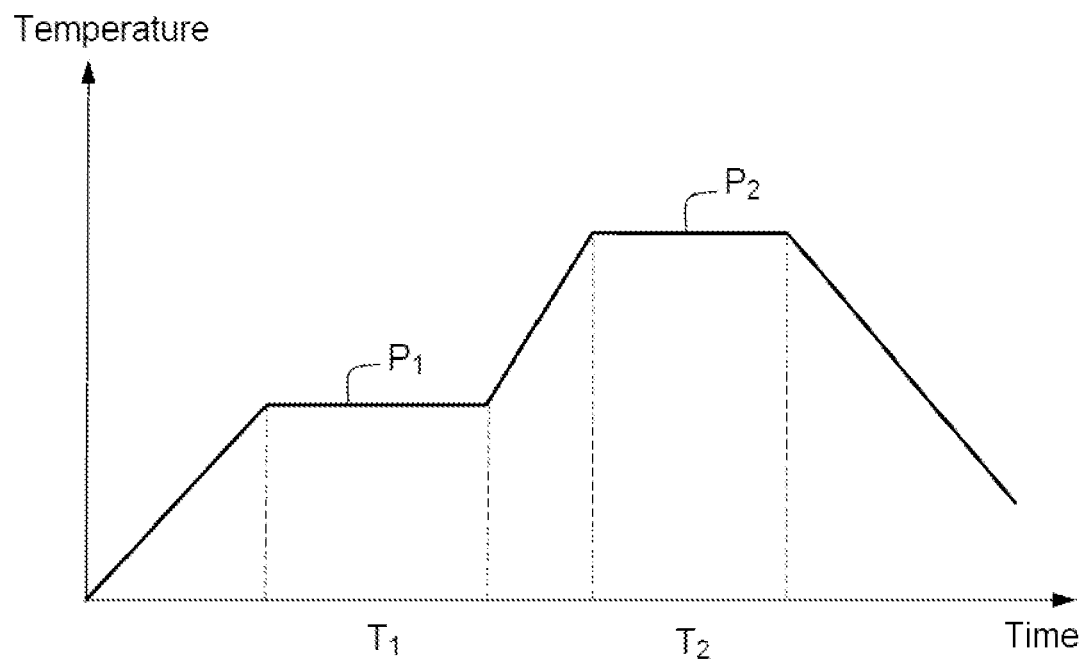
FIGS. 2a and 2b illustrate example brazing cycles allowing the joints present in a transducer of the present invention to be obtained.

The brazing cycle comprises two temperature plateaus illustrated in FIG. 2a, in succession:
  a low-temperature first plateau P1 notably allowing the indium to melt: 170° C. for a length of time T1 equal to 1 hour, the maintenance of this plateau also making degassing possible;
  a temperature ramp between 170° C. and 650° C., 4 hours in length;
  a high-temperature second plateau P2: 650° C. for a length of time T2 equal to 2 hours; and
  a gradual decrease in temperature.

Figure 2B:
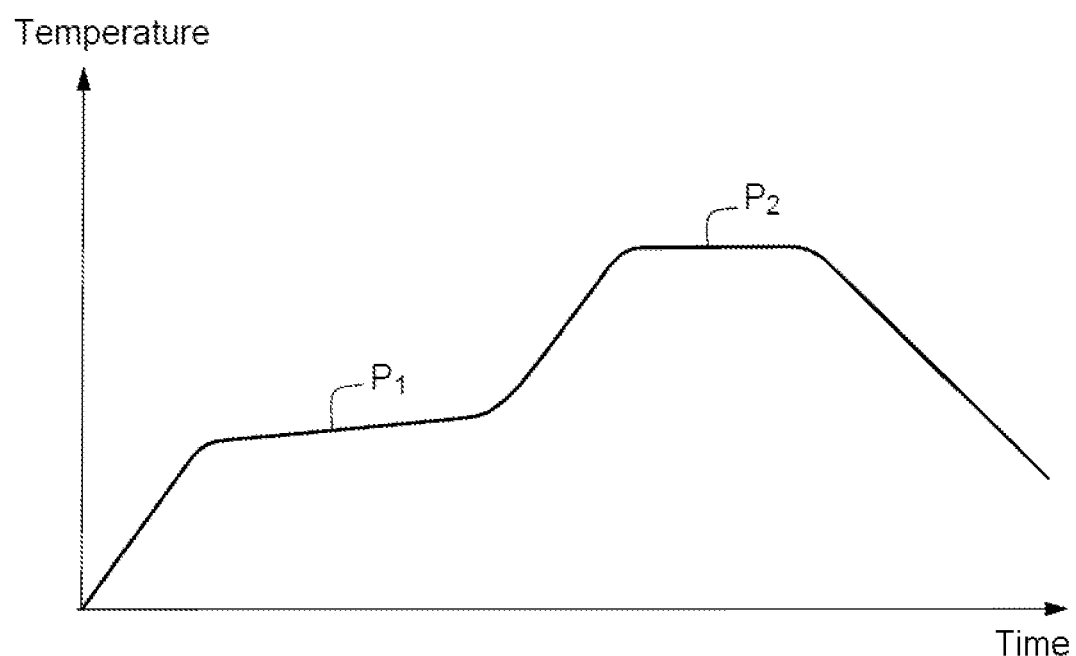

A variant brazing cycle is illustrated in FIG. 2b. Specifically, it will be noted that it is also possible to perform the brazing cycles with gradual increases and not strict plateaus.

It is also possible to employ intermediate plateaus in order to make it more likely that the parts to be brazed reach temperature equilibrium.

Generally, the four metal layers are deposited in succession without breaking vacuum between two successive depositions, and the deposits (their natures and thicknesses) are identical on the two parts to be assembled by brazing for reasons of symmetry, it not however being absolutely necessary for the layers to have equal thicknesses.

The thicknesses of indium and gold intended to form the final gold and indium joint layer may advantageously be in a ratio of 2:5, corresponding to a theoretical indium percentage (indium/(indium+gold)) of about 13% by weight and 20% by number of atoms.

The specifics of the gold/indium composition and the brazing temperature/length provide the brazed assembly with a higher melting point and debonding temperature, and therefore, in practice, a higher maximum operating temperature, than that obtained with gold/indium-based bonding methods that use higher indium:gold ratios and that are limited to the "low-temperature" indium-melting plateau, i.e. to temperatures similar to that of the plateau P1, for which methods the melting point and debonding temperature of the assembly are too low for the aforementioned applications.

Figure 3:
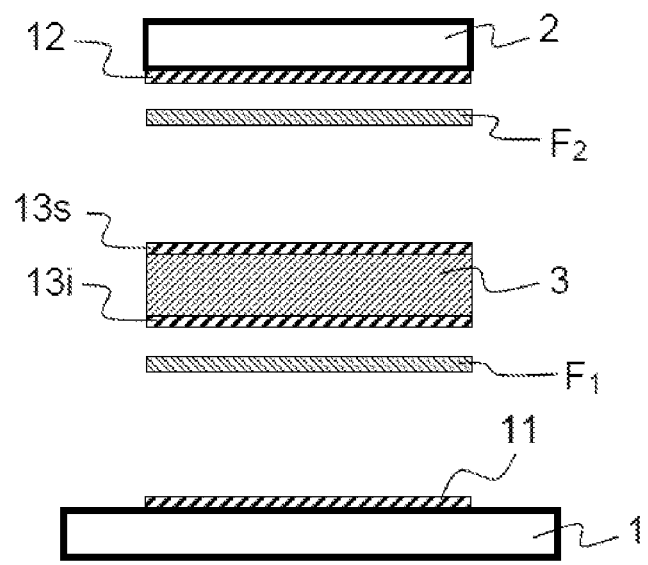
FIG. 3 illustrates a second embodiment of a transducer according to the invention, comprising the use of intermediate foils.

Second Embodiment of an Assembly Used in a Transducer According to the Invention On one face of the support 1, on both faces of the converter 3, and on one face of the top electrode 2, a layer of gold, 11, 13$i$, 13$s$ and 12, respectively, is deposited as illustrated in FIG. 3 (after preliminary deposition of a tie layer, not shown in FIG. 3) and foils, F1 and F2, of gold and indium (indium foil inserted between two gold foils) or of a mixture of gold and indium are inserted between these various elements (in FIG. 3, F1 and F2 may represent a group of foils). Typically, the indium and gold foils may be about ten microns in thickness.

It is then possible to carry out one of the brazing cycles described above in order to obtain the transducer comprising the two gold-and-indium-based joints J1 and J2.

Example of a TUSHT Transducer of the Invention

Figure 4:
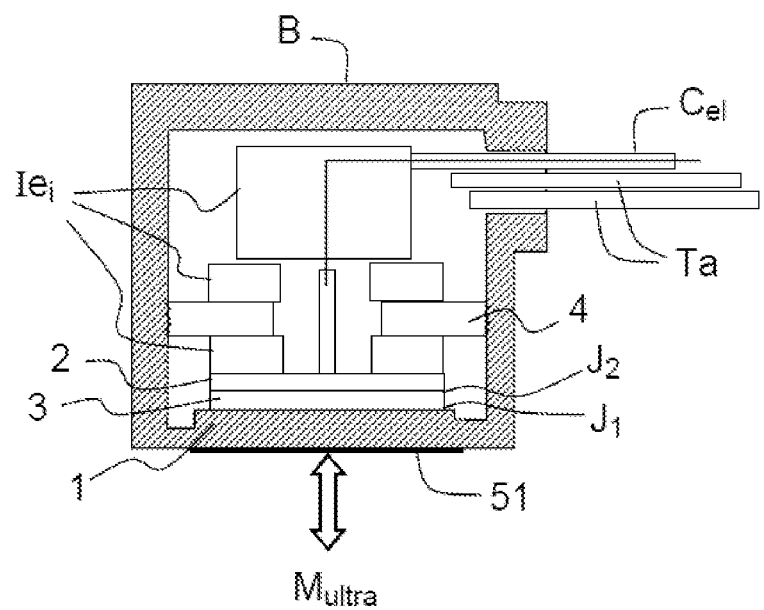
FIG. 4 illustrates a device comprising a transducer of the invention and means allowing it to be made to operate at temperatures commonly reaching 530° C. to 600° C., the operating temperature limit of the support/converter/electrode assembly being above 900° C.

The assemblies described above may advantageously be integrated into a TUSHT ultrasonic transducer such as shown in FIG. 4, and intended to be able to operate at very high temperatures, potentially about 900 to 1000° C., making it possible to envisage applications in the main vessel of a sodium-cooled fast-neutron nuclear reactor in all its operating regimes.

The converter 3 comprises a planar, piezoelectric, lithium niobate disk possibly and typically having a diameter of 40 mm or 15 mm or 6 mm and a thickness of 0.78 mm.

The steel plate 1 is flat and may be 1.2 mm in thickness. This conventional value is nonlimiting, it is nevertheless constrained by the requirement for long-term withstand to sodium exposure.

The electrode 2 is also made of steel and is flat and conventionally has a thickness comprised between 1 and 2 mm, these values being nonlimiting.

The plate is welded to a housing B, also made of steel.

The transducer is equipped with an electrical cable $C_{el}$ (a coaxial cable for example), the core of which is soldered to the electrode and the external steel cladding of which is soldered to the housing and therefore electrically connected to the plate.

A nut 4, screwed into the housing, may be brought to bear against the electrode via a washer made of an electrical insulator (of stumatite for example). This nut may be replaced by any device (spring, etc.) performing the same function.

The aim of the nut 4 is:

to oppose deformation of the plate that could damage the assembly, under the action of an external pressure for example. The dimensions of the nut are specified under physical temperature and pressure conditions representative of a pressurized water reactor vessel (170 bars, 320° C.). The nut is not necessary when operating under the normal conditions found in the main vessel of a liquid-sodium-cooled fast-neutron reactor (under low pressures the dimensions guarantee operation at 550° C. and 40 bars); and in the version with an unbrazed electrode, to press the electrode against the piezoelectric element (electrical continuity via resistive and/or capacitive contact).

The number, position and damping of resonant frequencies are adjusted by modifying the thicknesses of the acoustically coupled materials: plate, piezoelectric element, electrode or plate and piezoelectric element, depending on the variant.

A TUSHT may simultaneously possess several resonant frequencies (each possessing its own passband) and be used independently or simultaneously at each of these frequencies, as a transceiver for example, meaning that:

it is possible to perform measurements at various axial or lateral resolution scales (directivity), said scales being related to the frequency, via the wavelength of the signals; and it is possible to perform measurements at the one or more frequencies that are most appropriate depending on the attenuation of the acoustic waves by the propagation medium, which in general depends on the frequency and which may be a variable.

With standard dimensions, brazed TUSHTs may be used as emitters, as receivers, and as transceivers over a wide frequency range (up to 5 MHz at least).

Advantageously, the housing is furthermore equipped with aerating tubes Ta, and electrical insulators $I_{ei}$. A thin gold layer 51 may be provided on the exterior of the housing on the plate 1, in order to facilitate wetting (in the acoustic sense of transmission of ultrasound) by the propagating medium of the ultrasonic waves $M_{ultra}$, if said medium is liquid sodium at a low temperature (lower than 350° C.) for example.

The transducer of the present invention may also advantageously comprise:

multistrata assemblies containing one or more piezoelectric disks associated to form a Tonpilz transducer, under mechanical stress, with the aim of increasing the efficiency of the transducer (application to nonlinear acoustic techniques) optionally in association with a focusing plate.

It may also be advantageous to assemble multielement transducers (composed of juxtaposed blocks) usable in imaging devices implementing electronic or software-based methods for processing signals from the various elements (summations, combinations, delays, etc.).

Production may be carried out in various ways and for example:

by initially producing a conventional (single element) brazed support/converter/electrode assembly, then by defining blocks by machining notches (by mechanical sawing or by any other method) into the thickness of the assembly (these notches at least passing through the electrode, even the piezoelectric element and penetrating into the plate);

by initially producing a single element support/converter/electrode assembly the brazing metallizations of which (on the piezoelectric element, even on the plate and the electrode) are limited (by masking techniques, etc.) to blocks defining the elements of the transducer, then by mechanically separating the blocks by machining notches; or by individually brazing blocks (piezoelectric material and electrodes) cut out beforehand.

Lastly, it will be noted that the brazing assembly technique is adaptable to various geometries: axisymmetric bodies of revolution (disks), sheets (parallelepipedal, for example).

The invention claimed is:

1. A process for manufacturing a high-temperature ultrasonic transducer, said transducer comprising a steel or metal top electrode a piezoelectric converter, a steel or metal support ensuring the interface between the converter and the propagation medium of the acoustic waves, a first joint between the support and a piezoelectric material, and a second joint between the converter and the top electrode, comprising the following steps to produce said joints:

depositing a gold layer then depositing an indium layer on one of the faces of the top electrode, on both faces of the converter, and on one face of the steel support;

stacking the support, the converter, and the top electrode, this stack being maintained under pressure; and producing the indium-and-gold-compound-based first and second joints via a brazing and diffusing operation, said brazing and diffusing operation comprising the following steps:

a first step of increasing temperature to a first temperature comprised between about 150° C. and about 400° C. and of maintaining this first temperature for a first length of time corresponding to a first plateau; and a second step of increasing temperature to a second temperature comprised between about 400° C. and about 1000° C. and of maintaining this second temperature for a second length of time corresponding to a second plateau.

2. A process for manufacturing a high-temperature ultrasonic transducer, said transducer comprising a steel or metal top electrode, a piezoelectric converter, a steel or metal support ensuring the interface between the converter and the propagation medium of the acoustic waves, a first joint between the support and a piezoelectric material, and a second joint between the converter and the top electrode, comprising the following steps to produce said joints:

depositing a gold layer then depositing an indium layer on a first face of the converter, and on one face of the steel support;

the second face of the converter being, independently of the treatment carried out on the face of the electrode, left bare, or covered with a gold layer then an indium layer, or covered with a gold layer or a layer of any other, preferably non-oxidizable, material the electrical and dielectric properties of which are compatible with resistive and/or capacitive, for example, contact electrical coupling of the converter and the electrode;

the face of the electrode possibly being, independently of the treatment carried out on the second face of the converter, left bare, or covered with a gold layer then an indium layer, or covered with a gold layer or a layer of any other, preferably non-oxidizable, material the electrical and dielectric properties of which are compatible with resistive and/or capacitive, for example, contact electrical coupling of the electrode and the converter;

stacking the support and the converter, this stack being maintained under pressure, said first face of the converter facing said support;

producing the indium-and-gold-compound-based first joint via a brazing and diffusing operation, said brazing and diffusing operation comprising the following steps:
  a first step of increasing temperature to a first temperature comprised between about 150° C. and about 400° C. and of maintaining this first temperature for a first length of time corresponding to a first plateau; and
  a second step of increasing temperature to a second temperature comprised between about 400° C. and about 1000° C. and of maintaining this second temperature for a second length of time corresponding to a second plateau, stacking the top electrode on the converter; and
producing the second joint by bringing the converter and the top electrode into contact.

3. The process for manufacturing a high-temperature ultrasonic transducer as claimed in claim 1, wherein the piezoelectric material is lithium niobate.

4. The process for manufacturing a high-temperature ultrasonic transducer as claimed in claim 1, wherein the atomic percentage of indium is lower than about 35%.

5. The process for manufacturing a high-temperature ultrasonic transducer as claimed in claim 3, wherein the lithium niobate is a natural niobate or a niobate enriched with the lithium-7 isotope.

6. The process for manufacturing a high-temperature ultrasonic transducer as claimed in claim 3, wherein the lithium niobate has a Z-cut orientation (Y 90°).

7. The process for manufacturing a high-temperature ultrasonic transducer as claimed in claim 3, wherein the lithium niobate has a 36° Y-cut orientation or a 163° Y-cut orientation.

8. The process for manufacturing a high-temperature ultrasonic transducer as claimed in claim 1, wherein said first temperature is above the melting point of pure indium.

9. The process for manufacturing a high-temperature ultrasonic transducer as claimed in claim 8, wherein said first temperature is about 170° C.

10. The process for manufacturing a transducer as claimed in claim 1, wherein said second temperature is about 650° C.

11. The process for manufacturing a transducer as claimed in claim 1, wherein the first temperature has a slight positive gradient during the first length of time.

12. The process for manufacturing a high-temperature ultrasonic transducer as claimed in claim 1, wherein the first length of time is about 1 hour, the second length of time being about 2 hours, the temperature increase between said first temperature and said second temperature taking about 4 hours.

13. The process for manufacturing a transducer as claimed in claim 1, wherein the steps for producing the brazed joints are carried out under a secondary vacuum possibly of about $10^{-5}$ mbar.

14. The process for manufacturing a transducer according to claim 1, wherein the steps for producing the brazed joints are carried out while maintaining the assembly under a moderate compressive stress, which may be less than about 2 kg/cm$^2$.

15. The process for manufacturing a high-temperature ultrasonic transducer as claimed in claim 1, further comprising integrating the support/first junction/converter/second junction/top electrode assembly into a housing, said support being a plate integrated into said housing.

16. The process for manufacturing a high-temperature ultrasonic transducer as claimed in claim 15, wherein said housing comprises aerating means allowing the oxygen content in said housing to be renewed.

17. The process for manufacturing a high-temperature ultrasonic transducer as claimed in claim 1, further comprising, to produce the brazed joints:
  assembling the assembly made up of the top electrode, the converter and the support, or the converter and the support, in the presence of an intermediate foil based on gold and indium or mixtures of gold and indium between each of the aforementioned elements; and
  a brazing and diffusing operation.

18. The process for manufacturing a transducer as claimed in claim 17, further comprising producing preliminary gold layers on those faces of said elements which are intended to face each other during the brazing assembly operation so as to promote the adherence of said foils based on gold and indium or mixtures of gold and indium.

19. The process for manufacturing a transducer as claimed in claim 1, wherein the layers are deposited by sputtering.

20. The process for manufacturing a transducer as claimed in claim 1, further comprising prior to depositing the gold layers, producing tie layers on the faces of the electrode and/or of the converter and/or of the support.

21. The process for manufacturing a transducer as claimed in claim 20, wherein the one or more tie layers are based on chrome and/or chrome nickel or titanium.

22. The process for manufacturing a transducer as claimed in claim 1, further comprising depositing a protective layer on the indium layer.

23. The process for manufacturing a transducer as claimed in claim 22, wherein the protective layer is based on gold.

* * * * *